PRONG RECEIVING CONNECTOR MEMBER

Filed Nov. 4, 1955 2 Sheets-Sheet 1

INVENTOR.
Ronald S Narozny,
BY Wilkinson, Huxley,
Byron + Hume
attys.

PRONG RECEIVING CONNECTOR MEMBER

Filed Nov. 4, 1955 2 Sheets-Sheet 2

INVENTOR.
Ronald S. Narozny,
BY Williamson, Hofley, Byron + Hume
Attys.

United States Patent Office 2,814,024

Patented Nov. 19, 1957

2,814,024

PRONG RECEIVING CONNECTOR MEMBER

Ronald S. Narozny, Chicago, Ill., assignor to Malco Tool & Mfg. Co., Chicago, Ill., a partnership Application November 4, 1955, Serial No. 544,896

4 Claims. (Cl. 339—193)

This invention relates to a prong receiving connector member and more particularly, to a connector that is adapted to be mounted by insertion into an opening in a baseboard such as a printed circuit board.

The connector member which is the subject matter of this invention is particularly suited to electronic or electrical assemblies of the so-called "printed circuit" variety, wherein various conductive paths are provided by securing conductive material to an insulating baseboard in a preselected pattern. Suitable openings are provided in the board for making electrical connection with the conductive material by wiring leads, terminal pins and the like. This electrical connection is conventionally formed by dip soldering the entire board so that all of the connections are simultaneously made by the formation of a solder joint between the conductive material on the board in association with the openings and the terminal lead, pin or the like which has been inserted therein.

In the past, component parts of an electrical circuit, such as vacuum tubes, have been provided with a rigid base member having a plurality of terminal prongs projecting therefrom. A suitable prong receiving socket has been provided to receive the prongs so mounted in such a base member, this socket therefore becoming the mounting member for such a component. With the advent of the printed circuit boards just described, it has become desirable to permit components, such as vacuum tubes, to be mounted directly in the baseboard in the same fashion as other components having wiring leads or terminal pins.

It is, therefore, an object of this invention to provide a prong receiving connector member which is adapted to be readily mounted in a baseboard of the printed circuit variety.

Another object is to provide such a connector member which is capable of being arranged in a symmetrical grouping of any desired pattern such as the conventional circular pattern of the terminal prongs on the base of a vacuum tube.

Still another object is to provide a connector member of the character described which will be maintained with reasonable security in the mounted position in a baseboard prior to any soldering operation.

Yet another object is to provide a connector member such as has been described which can be readily and completely secured in rigid relation to the supporting baseboard and an electrical connection simultaneously made with the conductive material attached to the baseboard by the conventional dip soldering operation.

Still another object is to provide a connector member of the character described which is self-blocking with respect to the baseboard into which it is adapted to be inserted.

Yet another object is to provide a connector which will readily receive, but positively grip a connector prong in firmly supported relation and at the same time establish full electrical connection with such a prong.

This application is a continuation-in-part of applicant's copending application Serial No. 499,615, entitled "Terminal Pin," filed April 6, 1955.

Further objects and advantages of this invention will become evident as the description proceeds and from an examination of the accompanying drawing which illustrates one embodiment of the invention and in which similar numerals refer to similar parts throughout the several views.

Figure 3:
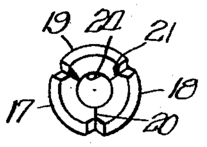
Figure 3 is a plan view from above of the connector member shown in Figure 1.

Referring now to Figures 1, 2, 3 and 4, a connector member embodying one form of the invention is indicated generally therein by the numeral 10. The connector member is generally tubular and is preferrably formed from one piece of material which is rolled into tubular form after being suitably cut and shaped. The connector has a generally cylindrical body 14 with a longitudinal slit 16 formed therein by the two edges of the rolled sheet material being brought together in the forming operation. A plurality of fingers 17, 18 and 19 are formed by the opening 20 which is a continuation of the slit 16, and two additional openings, such as the opening 21 best shown in Figure 2. Each of the fingers 17, 18 and 19 are constricted inwardly at a point adjacent the upper end 22 of the connector member 10 so as to form an area of reduced diameter 24, as best shown in Figure 3. This constricted area 24 provides a contact point for a terminal pin or prong which may be inserted longitudinally into the connector member 10 so that it is received within the tubular body portion 14. The openings 20 and 21 permit the fingers 17, 18 and 19 to expand radially outward, in response to the force exerted by the tip of a prong being inserted in the end 22 of the connector member.

Figure 1:
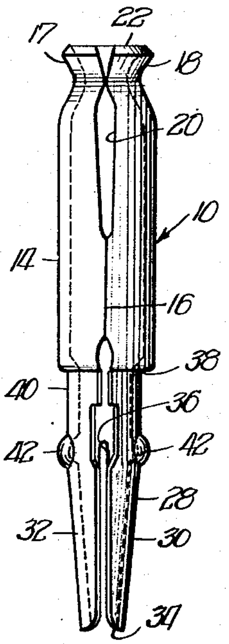
Figure 1 is a view in side elevation of one form of connector member embodying the present invention.
Figure 2:
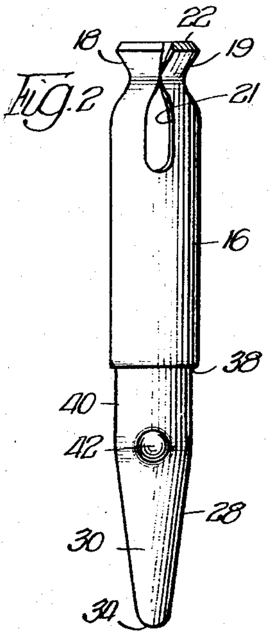
Figure 2 is a view in side elevation of the pin shown in Figure 1, the view being taken from the right side of the connector member as shown in Figure 1.
Figure 4:
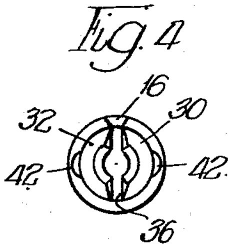
Figure 4 is a plan view from below of the connector member shown in Figure 1.

The connector member 10 is also provided with a nose portion 28 which is preferably formed of a pair of skirts or fingers 30 and 32, as best shown in Figures 1 and 4. The slit 16 continues longitudinally throughout the connector member terminating at the tip 34 of the nose portion 28. The slit 16 is widened between the skirts or fingers 30 and 32 to permit contraction thereof, for a purpose which will later appear. A second slit 36 is formed diametrically opposite to the slit 16 in the nose portion 28, this slit being shown in Figures 1 and 4. A shoulder 38 is formed between the body 14 and the upper end 40 of the nose portion 28 of the connector member 10. This upper end 40 of the nose portion 28 is cylindrical in form and at the base thereof a pair of outwardly struck projections 42 is provided, one such projection preferably being formed on each finger 30 and 32, respectively. Between these projections 42 and the lower tip 34 of the nose portion 28, the two fingers 30 and 32 taper inwardly toward the tip 34.

Figure 5:
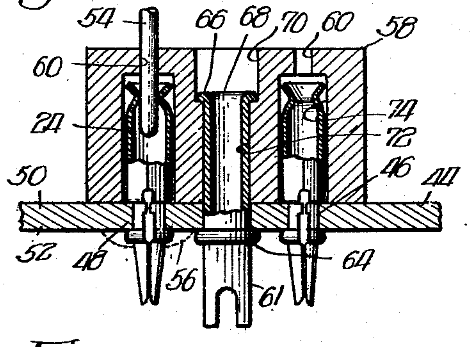
Figure 5 is a view in elevation and partly in vertical section of a plurality of connector members of the form shown in Figure 1, secured in association with a printed circuit board and with a molded socket member, the pattern of arrangement being such as to permit said connector members to receive the terminal prongs of a vacuum tube.
Figure 7:
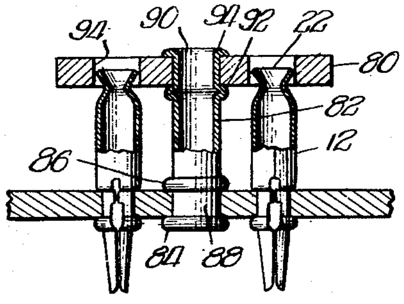
Figure 7 is a view in elevation and partly in vertical section of an assembly similar to that shown in Figure 5, the connector member is shown in secured relation to a printed circuit board and being arranged so as to receive the terminal prongs of a vacuum tube.

As best shown in Figures 5 and 7, the connector member 12, just described, is adapted to be readily inserted and seated by "snap action" in a suitable opening in a printed circuit board 44 such as the openings 46 and 48 shown in Figure 5, a fragmentary portion of which is shown in Figure 5. The tip 34 of the nose portion 28 can be readily inserted in such an opening 46 because of the tapered form thereof, and as the connector member 10 is moved downwardly into the opening, the projections 42 are first brought into abutment with the upper surface 50 of the printed circuit board 44. Further movement of the connector member longitudinally toward the opening 46 causes the fingers 30 and 32 to be compressed by the camming action of the rounded projections 42 as they are forced into the opening 46. This constriction of the nose 28 of the connector member 12 permits the connector member to move further downwardly into the opening 46 and as the shoulder portion 38 between the body 14 and the nose portion 28 of the connector is brought into abutment with the upper surface 50 of the printed circuit board 48 the projections 42 simultaneously pass beyond the lower limit of the opening 46 and come into association with the lower surface 52 of the printed circuit board 44. This permits the two fingers 30 and 32 to snap outwardly and to secure the connector member in the opening 46 so that it cannot be removed therefrom without the exertion of a substantial amount of force in a direction opposite to the previous seating motion.

A connector member so secured in the printed circuit board 44 is adapted to receive a terminal pin, such as the pin 54 shown in Figure 5, as previously described in connection with the description of Figures 1 to 4. It is possible to dispose a plurality of connector members 10 in a circular form, such as the pattern shown in Figure 6, in secured relation to a printed circuit board and thus form a socket member for the terminal prongs of a vacuum tube. The finished assembly may, of course, be dip soldered so that a soldered joint 56, shown in dotted lines in Figure 5, is formed between the tip 28 of the connector member 10 and the conducting portion of the printed circuit disposed on the bottom surface 52 of the printed circuit board 44. The connector members will then be held in very rigid relation with respect to the board 48 and a satisfactory pin terminal receiving socket member will thus be formed.

If a more rigid assembly is desired, however, a supporting member, such as the socket element 58, can be secured in association with the connector members 12 so that the prong receiving openings 60 in the socket element form additional support for the prongs of a tube base. The support element 58, for example, can be secured to the baseboard 44 by a support post 61 secured in a central opening 62 in the baseboard 44. A bead 64 on the supporting post 61 can be provided to abut the bottom surface 52 of the baseboard 44 and a lip 66 can be formed at the upper end 68 of the terminal post 61 to cooperate with a shoulder formed at the bottom of the recess 70 formed in the center of the support element 58 at the top of the bore 72 through which the supporting post 61 extends. Suitable openings 74 are provided below each opening 60 into which the body 14 of each connector member 10 is adapted to be received. With the connector members so disposed, a pin 54 can be first inserted in the opening 60 in the support element 58 and as it passes downwardly therethrough it will enter into the connector member 10, as previously described, and will, therefore, be supported by both the supporting element 58 and the connector member 10 disposed within the recess 74. This construction provides a very firm and stable socket.

Figure 6:
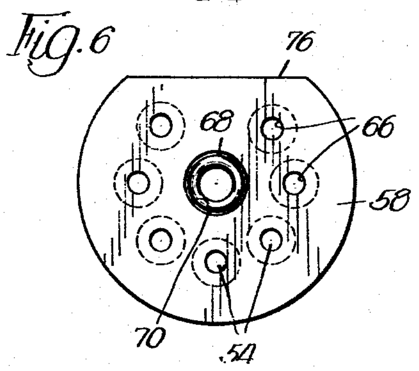
Figure 6 is a plan view from above of the assembly shown in Figure 5.

As shown in Figure 6, the support member 58, which is generally circular, may be provided with one flat side 76 to aid in its alignment particularly where the components are being fed and assembled automatically. The form of the connector members 10 is also such that they lend themselves very readily to being fabricated in a chain form so that they can be fed into a mechanism which severs them from the chain and automatically introduces and secures them in the appropriate openings in a printed circuit board.

Figure 8:
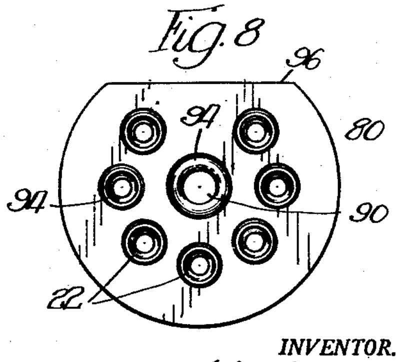
Figure 8 is a plan view from above of the assembly shown in Figure 7.

An alternative form of socket assembly is shown in Figures 7 and 8 wherein a socket of the wafer type is shown. A plurality of connector members 10 are mounted in a printed circuit board 78 substantially in the same fashion as previously described in connection with Figures 5 and 6. The supporting element 80, however, is in the form of a relatively thin wafer supported by a supporting post 82. The post 82 has spaced beads 84 and 86 which are adapted to secure its lower end 88 to the board 78. The opposite end 90 of the supporting post 82 is provided with a similar bead 92 upon which the wafer 80 rests and a lip 94 is formed after the wafer 80 is in place on the post 82 to maintain the wafer secured in its proper position. The wafer is provided with a plurality of openings 94 into which are received the upper ends 22 of the connector members 10.

In this form of socket the wafer 80 provides additional support for the connector members 10, but the terminal prongs which are inserted into the connector members are not supported directly by the wafer socket 80, as in the case of the socket member 58 shown in Figure 5. Otherwise the function of this form of socket assembly is substantially the same as that previously described and the wafer 80 may be provided with a flat side 96 for alignment purposes, as described in connection with the socket element 58 shown in Figure 6.

Figure 9:
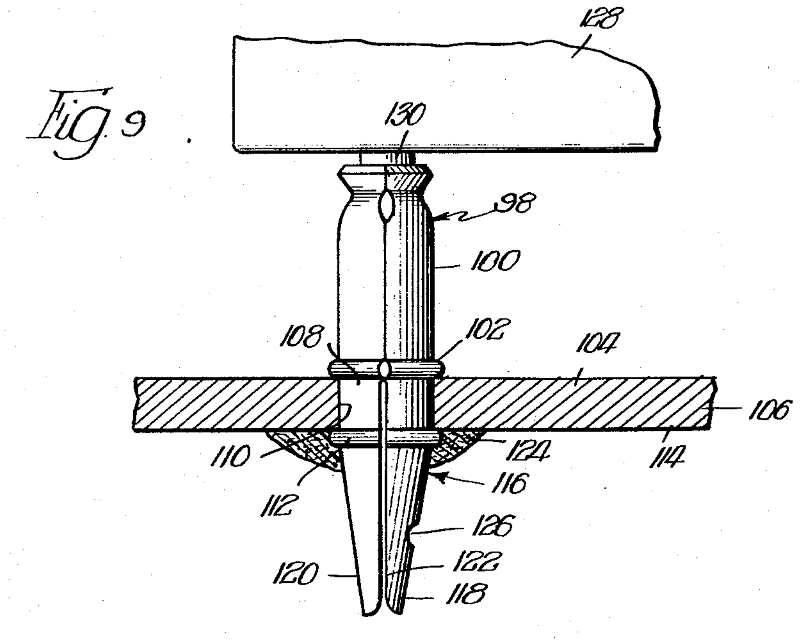
Figure 9 is a view in elevation and partly in vertical section of an alternative form of connector member, the connector member being shown in association with a printed circuit board.

Another form of connector member 98 embodying the invention is shown in Figure 9 wherein the body portion 100 is formed substantially in the same fashion as the body portion 16 of the connector member shown in Figure 1. However, instead of a shoulder, an annular bead 102 is formed at the base thereof which is adapted to abut the top surface 104 of the printed circuit board 106. A cylindrical intermediate portion 108 is disposed below the bead 102 and this portion is adapted to be received in a suitable opening in the printed circuit board 106 such as the opening 110. A second bead member 112 is formed at the base of this intermediate portion 108 and is adapted to snap into abutment with the bottom surface 114 of the printed circuit board 106 when the connector member is secured in place in the board. The lowest portion 116 of the connector member 98 is formed with two fingers or skirts 118 and 120 having a longitudinal slit 122 therebetween which permits the inward compression of the two fingers 118 and 120 when the connector member is being installed in the opening 110. This allows the bead 112 to pass through the opening 110 and to snap into place in abutment with the underside 114 of the printed circuit board 106. Here again the conductive circuit material on the underside 114 of the printed circuit board 106 is thus brought into electrical contact with the connector member through the bead 112. In order to insure that adequate contact is obtained, a solder joint 124 is normally made by dip soldering the circuit board in the manner previously described.

The finger 118 is shown with a concave dimple 126 formed therein which dimple provides a means for securing a wire lead to the nose 116 if desired. This wire lead would also be secured with a solder joint by the same dip soldering step. A fragmentary portion of a vacuum tube base 128 is shown disposed in association with the connector member 98 the pin or prong 130 having been inserted therein as previously described in connection with the pin 54 shown in Figure 5. This form of pin 98 could, of course, have associated with it support members of the type shown in Figures 5 and 7 if desired.

Figure 10:
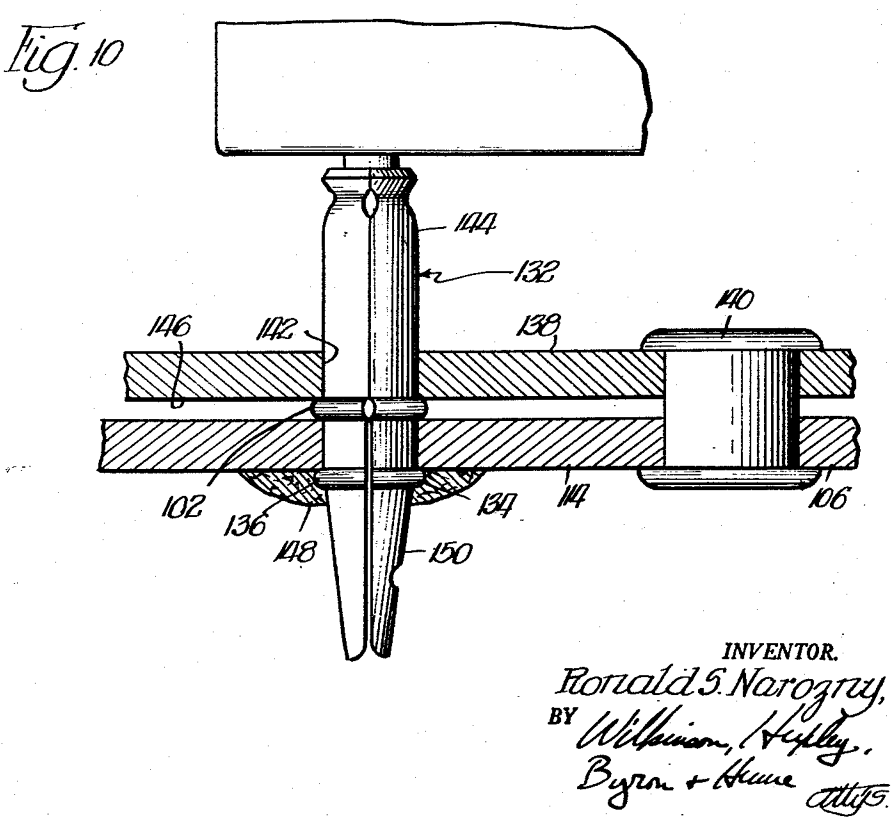
Figure 10 is a view in elevation and partly in vertical section of still another form of connector member and a fragmentary portion of a vacuum tube connector prong receiving assembly of which said connector member is a part.

Another form of support member which may be utilized with the form of connector last discussed is shown in Figure 10 in association with a connector member indicated generally by the numeral 132. This connector has a construction identical with the connector member 98 shown in Figure 9 except that beadlike projections 134 and 136 are provided adjacent the lower surface 114 of the printed circuit board 106 rather than the annular bead 112 incorporated in the connector member 98. A wafer or washer 138 is secured to the printed circuit board 106 by a rivet member 140. Suitable openings, such as the opening 142, are provided in the wafer 138 to receive the body portion 144 of the connector member 132 so that the bottom surface 146 of the wafer may be brought into abutment with the bead 102 and held snugly in that position by the rivet 140. Here again a solder joint 148 may be formed adjacent the beads 134 and 136 forming an electrical contact between the nose 150 of the connector member and the conducting material forming the electrical circuit on the bottom surface 114 of the board 106.

A snap-in type prong receiving connector member is thus provided which is adapted to be mounted singly in a printed circuit board or like element, or which can be used to form a multiple prong receiving connector or socket for a vacuum tube or the like. This type of pin is readily adapted for use in automatic dispensing and setting machines, as was pointed out above, and provides a means of assembly of the terminal components of an electrical circuit on a printed circuit board which can be quickly carried out and at a minimum of expense.

In the drawing and specification, there has been set forth a preferred embodiment of the invention, and although specific terms are employed, they are used in a generic and descriptive sense only and not for purposes of limitation. Changes in form and in the proportion of parts, as well as the substitution of equivalents are contemplated, as circumstances may suggest or render expedient, without departing from the spirit or scope of this invention as further defined in the following claims.

What is claimed is:

1. A prong receiving connector member adapted to be mounted by insertion into an opening of predetermined cross section in a printed circuit board of predetermined thickness, said connector member comprising a tubular metal element having a body portion, a mounting portion and a nose portion, said mounting portoin having a length exceeding said board thickness and an external cross section substantially corresponding to the opening cross section, said nose portion being elongated and having its external surface gradually tapered from the cross section of said mounting portion to a cross section substantially less than the opening cross section, an integral annular shoulder formed between said body portion and said mounting portion for contact with the surface of the board surrounding the opening wherein the mounting portion is inserted, said mounting portion having a pair of opposite outwardly struck rounded projections having board surface contacting margins facing said shoulder and spaced therefrom a distance substantially equal to said board thickness, said projections normally extending outwardly a distance greater than the distance across the opening in said board, a pair of slots extending from the nose end of said connector member through a substantial distance beyond said projections, said slots being of sufficient width to permit contraction of the cross section of said mounting and nose portions to permit said projections to pass through the opening in said board, said body portion having a constricted area at its end opposite said shoulder and having an outwardly flared end above said constricted area, and a plurality of longitudinal slots extending from said flared end of said connector member to a substantial distance beyond said constricted area, whereby said connector member may be snapped in and resiliently held in said board opening and whereby said constricted area is adapted to frictionally engage a prong inserted in said connector.

2. A prong receiving connecting member according to claim 1 wherein said body portion is of larger cross section than said mounting portion to provide said annular shoulder at the juncture of said body and mounting portions.

3. A prong receiving connecting member according to claim 1 wherein said body portion and said mounting portion have substantially the same cross section and an annular bead is provided therebetween to form said shoulder.

4. A vacuum tube socket comprising a plurality of prong receiving connecting members disposed in preselected spaced relation one to another in suitable openings of predetermined cross section in a printed circuit board of predetermined thickness, each said connecting member comprising a tubular metal element having a body portion, a mounting portion and a nose portion, said mounting portion having a length exceeding said board thickness and an external cross section substantially corresponding to the opening cross section, said nose portion being elongated and having its external surface gradually tapered from the cross section of said mounting portion to a cross section substantially less than the opening cross section, an integral annular shoulder formed between said body portion and said mounting portion for contact with the surface of the board surrounding the opening wherein the mounting portion is inserted, said mounting portion having a pair of opposite outwardly struck rounded projections having board surface contacting margins facing said shoulder and spaced therefrom a distance substantially equal to said board thickness, said projections normally extending outwardly a distance greater than the distance across the opening in said board, a pair of slots extending from the nose end of said connection member through a substantial distance beyond said projections, said slots being of sufficient width to permit contraction of the cross section of said mounting and nose portions to permit said projections to pass through the opening in said board, said body portion having a constricted area at its end opposite said shoulder and having an outwardly flared end above said constricted area, and a plurality of longitudinal slots extending from said flared end of said connector member to a substantial distance beyond said constricted area, whereby said connector members may be snapped in and resiliently held in said board openings and whereby said constricted areas are adapted to frictionally engage prongs inserted in said connectors.

References Cited in the file of this patent

UNITED STATES PATENTS

| | | |
|---|---|---|
| 2,542,144 | Kearns | Feb. 20, 1951 |
| 2,689,337 | Burtt | Sept. 14, 1954 |
| 2,747,169 | Johanson | May 22, 1956 |